United States Patent
Wittenberg et al.

(10) Patent No.: US 10,783,430 B2
(45) Date of Patent: Sep. 22, 2020

(54) SIGNAL REMOVAL TO EXAMINE A SPECTRUM OF ANOTHER SIGNAL

(71) Applicants: The Boeing Company, Chicago, IL (US); HRL Laboratories, LLC, Malibu, CA (US)

(72) Inventors: Peter S. Wittenberg, Creve Coeur, MO (US); Peter Petre, Oak Park, CA (US); Shankar R. Rao, Agoura Hills, CA (US)

(73) Assignees: The Boeing Company, Chicago, IL (US); HRL Laboratories, LLC, Malibu, CA (US)

( * ) Notice: Subject to any disclaimer, the term of this patent is extended or adjusted under 35 U.S.C. 154(b) by 761 days.

(21) Appl. No.: 15/276,188

(22) Filed: Sep. 26, 2016

(65) Prior Publication Data

US 2018/0089558 A1  Mar. 29, 2018

(51) Int. Cl.
*G06N 3/06* (2006.01)
*G06N 3/063* (2006.01)
(Continued)

(52) U.S. Cl.
CPC ......... *G06N 3/0635* (2013.01); *G01R 23/167* (2013.01); *G06F 17/16* (2013.01);
(Continued)

(58) Field of Classification Search
None
See application file for complete search history.

(56) References Cited

U.S. PATENT DOCUMENTS

| 5,325,095 A | 6/1994 | Vadnais et al. |
| 5,402,520 A | 3/1995 | Schnitta |

(Continued)

FOREIGN PATENT DOCUMENTS

| CN | 102281221 A | 12/2011 |
| CN | 105704075 A | 6/2016 |
| WO | WO 2018136144 A1 | 7/2018 |

OTHER PUBLICATIONS

Evangelista, et al., Chapter 1: Sound Source Separation, Digital Audio Effects, 2nd edition, Zoelzer (ed.), John Wiley and Sons (2011), pp. 1-42 (Year: 2011).*

(Continued)

*Primary Examiner* — Wilbert L Starks
(74) *Attorney, Agent, or Firm* — Sage Patent Group

(57) ABSTRACT

A method for removing an extracted RF signal to examine a spectrum of at least one other RF signal includes receiving a mixture signal by an ADC. The mixture signal includes a plurality of separate signals from different signal sources. The mixture signal is digitized by the ADC. A first digitized signal and a second digitized signal are generated that are the same. The first digitized signal is delayed a predetermined time delay and the second digitized signal is processed in a neuromorphic signal processor to extract an extracted signal. The predetermined time delay corresponds to a delay embedding in the neuromorphic signal processor. A phase delay and amplitude of the extracted signal is adjusted based on a phase delay and amplitude of the first digitized signal. An adjusted extracted signal is cancelled from the first digitized signal to provide an input examination signal for examination.

20 Claims, 7 Drawing Sheets

(51) Int. Cl.

| | |
|---|---|
| *G01R 23/167* | (2006.01) |
| *G06F 17/16* | (2006.01) |
| *G06N 3/04* | (2006.01) |
| *G06N 3/08* | (2006.01) |
| *H03F 3/19* | (2006.01) |
| *H04B 1/00* | (2006.01) |
| *H04B 1/12* | (2006.01) |
| *H03H 17/02* | (2006.01) |
| *H03H 17/00* | (2006.01) |
| *H03H 21/00* | (2006.01) |

(52) U.S. Cl.
CPC ......... *G06N 3/0445* (2013.01); *G06N 3/084* (2013.01); *H03F 3/19* (2013.01); *H03H 17/0294* (2013.01); *H04B 1/0007* (2013.01); *H04B 1/123* (2013.01); *G06N 3/06* (2013.01); *H03F 2200/451* (2013.01); *H03H 21/0012* (2013.01); *H03H 2017/009* (2013.01); *H03H 2017/0081* (2013.01)

(56) References Cited

U.S. PATENT DOCUMENTS

| | | | |
|---|---|---|---|
| 5,499,029 | A | 3/1996 | Bashforth et al. |
| 5,504,487 | A | 4/1996 | Tucker |
| 5,694,474 | A | 12/1997 | Ngo et al. |
| 7,403,144 | B1 | 7/2008 | Cruz-Albrecht et al. |
| 7,822,698 | B1 | 10/2010 | Cruz-Albrecht et al. |
| 8,031,117 | B2 | 10/2011 | Goldberg |
| 8,548,656 | B1 | 10/2013 | Blake |
| 8,566,265 | B1 | 10/2013 | Cruz-Albrecht et al. |
| 8,959,040 | B1 | 2/2015 | Cruz-Albrecht et al. |
| 8,977,578 | B1 | 3/2015 | Cruz-Albrecht et al. |
| 9,042,496 | B1 | 5/2015 | Su |
| 9,749,007 | B1 | 8/2017 | Martin et al. |
| 9,753,121 | B1 | 9/2017 | Davis et al. |
| 9,791,564 | B1 | 10/2017 | Harris et al. |
| 2005/0267377 | A1 | 12/2005 | Marossero et al. |
| 2006/0208169 | A1 | 9/2006 | Breed et al. |
| 2008/0204309 | A1 | 8/2008 | Reeves |
| 2010/0106356 | A1 | 4/2010 | Trepagnier et al. |
| 2011/0128178 | A1 | 6/2011 | Dafesh et al. |
| 2012/0232418 | A1 | 9/2012 | Kimura et al. |
| 2012/0250748 | A1 | 10/2012 | Nguyen et al. |
| 2012/0313813 | A1 | 12/2012 | Brooks |
| 2014/0079248 | A1 | 3/2014 | Short et al. |
| 2014/0180914 | A1 | 6/2014 | Abhyanker |
| 2015/0202770 | A1 | 7/2015 | Patron et al. |
| 2015/0208945 | A1 | 7/2015 | Lux et al. |
| 2015/0287422 | A1 | 10/2015 | Short et al. |
| 2016/0054432 | A1 | 2/2016 | Lilburn et al. |
| 2016/0072543 | A1 | 3/2016 | Abrishamkar et al. |
| 2016/0171974 | A1 | 6/2016 | Hannun et al. |
| 2016/0261793 | A1 | 9/2016 | Sivan |
| 2017/0153318 | A1 | 6/2017 | Meltzer et al. |
| 2017/0199270 | A1 | 7/2017 | Huemer et al. |
| 2017/0212205 | A1 | 7/2017 | Bialer et al. |
| 2018/0164406 | A1 | 6/2018 | Culkin |
| 2018/0197089 | A1 | 7/2018 | Krasser et al. |
| 2019/0120932 | A1 | 4/2019 | Smith et al. |
| 2019/0324108 | A1 | 10/2019 | Wittenberg et al. |

OTHER PUBLICATIONS

Guldenschuh, et al., Prediction Filter Design for Active Noise Cancellation Headphones, IET Signal Processing, (2013) pp. 1-8 (Year: 2013).*

Cho, et al., Active Noise Canceling using Analog NeuroChip with On-Chip Learning Capability, NIPS'98 Proceedings of the 11th International Conference on Neural Information Processing Systems, (1998) pp. 664-670 (Year: 1998).*

Chen, et al., Active Cancellation System of Acoustic Noise in MR Imaging, IEEE Transactions on Biomedical Engineering, vol. 46, No. 2, (1999) pp. 186-191 (Year: 1999).*

Wikipedia; "Recurrent neural network," downloaded from <https://en.wikipedia.org/wiki/Recurrent_neural_network> on Sep. 26, 2016, 6 Pages.

Wikipedia; "Rprop," downloaded from <https://en.wikipedia.org/wiki/Rprop> on Sep. 26, 2016; 2 Pages.

Wikipedia; "Spectral density estimation," downloaded from <https://en.wikipedia.org/wiki/Spectral_density_estimation> on Sep. 26, 2016, 8 Pages.

Wikipedia; "State-space representation," downloaded from <https://en.wikipedia.org/wiki/State-space_representation> on Sep. 26, 2016, 11 Pages.

S. Choi, A. Cichocki, H.-M. Park, and S.-Y. Lee, "Blind Source Separation and Independent Component Analysis: A Review," Neural Information Processing—Letters, vol. 6, No. 1, pp. 1-57, Jan. 2005.

A. Cichocki and A. Belouchrani, "Sources separation of temporally correlated sources from noisy data using a bank of band pass filters," in Proc. of Independent Component Analysis and Signal Separation (ICA-2001), pp. 173-178, San Diego, USA, Dec. 9-13, 2001.

A. Hyvarinen, "Complexity Pursuit: Separating Interesting Components from Time Series," Neural Computation, vol. 13, No. 4, pp. 883-898, Apr. 2001.

C. Igel and M. Husken, "Improving the Rprop learning algorithm," in Proc. of the 2nd Int. Symposium on Neural Computation (NC'2000), pp. 115-121, ICSC Academic Press, 2000.

R.H. Walden, "Analog-to-digital converter survey and analysis," IEEE J. Sel. Areas Commun., vol. 17, No. 4, pp. 539-548, Apr. 1999.

H. Jaeger and H. Haas, "Harnessing Nonlinearity: Predicting Chaotic Systems and Saving Energy in Wireless Communication," Science, vol. 304, No. 5667, pp. 78-80, 2004.

R. Legenstein and W. Maass, "Edge of chaos and prediction of computational performance for neural circuit models," Neural Networks, 20(3), pp. 323-334, 2007.

W. Maass, "Liquid Computing," Proc. of the Conference CiE'07: Computability in Europe 2007, Siena, Italy, 10 pages.

F. Takens, "Detecting strange attractors in turbulence," Dynamical Systems and Turbulence, Lecture Notes in Mathematics, vol. 898, 16 pages, 1981.

D. Verstraeten et al., "An experimental unification of reservoir computing methods," Neural Networks, 20(3), pp. 391-403, 2007.

H. Yap et al., "A First Analysis of the Stability of Takens' Embedding," in Proc. of the IEEE Global Conference on Signal and Information Processing (GlobalSIP) symposium on Information Processing for Big Data, 5 pages, Dec. 2014.

Appeltant, L. et al., "Information processing using a single dynamical node as complex system," Nature Communications, 2011, pp. 1-6.

Candes, Emmanuel J.; et al.; "Near-Optimal Signal Recovery From Random Projections: Universal Encoding Strategies?" IEEE Transactions on Information Theory, 2006, pp. 5406-5425, vol. 52.

Mann, Steve, et al.; "The Chirplet Transform: a Generalization of Gabor's Logon Transfrom," Proc. Vision Interface, 1991, pp. 205-212.

Extended European Search Report dated Feb. 27, 2019 for European Patent Application No. 18194748.2, 14 pages.

Extended European Search Report dated Sep. 25, 2019 for European Patent Application No. 19170599.5, 6 pages.

Chinese First Office Action dated May 21, 2020 for Chinese Patent Application No. 201710683990.7, 5 pages.

* cited by examiner

SIGNAL REMOVAL TO EXAMINE A SPECTRUM OF ANOTHER SIGNAL

GOVERNMENT RIGHTS

This invention was made with U.S. Government support under Contract N00014-12-C-0027 awarded by the Office of Naval Research (ONR). The Government has certain rights in this invention.

CROSS-REFERENCE TO RELATED APPLICATION

This application is related to U.S. patent application Ser. No. 15/073,626, filed Mar. 17, 2016, now U.S. Pat. No. 9,749,007, which issued on Aug. 29, 2017, entitled "Cognitive Blind Source Separator," and is assigned to one of the assignees of the present invention and is incorporated herein by reference.

FIELD

The present disclosure relates to communications, examination or analysis of communications signals and more particularly to signal removal to examine a spectrum of another signal, such as a lower level signal or signals.

BACKGROUND

Dynamic range limitations exist with respect to examining a spectrum of a low level signal or signals that have a lower amplitude than another signal or signals with a larger amplitude when the low level signals are received in combination with the larger level signal or signals. Using fast Fourier transform (FFT) based spectral analysis is often limited by the side lobes of the FFT filters and cancellation systems have relatively slow response times. Accordingly, there is a need for a system and method for signal removal to examiner a spectrum of a lower level signal or signals that is not subject to the foregoing disadvantages.

SUMMARY

In accordance with an embodiment, a method for removing an extracted radio frequency (RF) signal to examine a spectrum of at least one other RF signal includes receiving a mixture signal by an analog-to-digital converter (ADC). The mixture signal includes a plurality of separate source signals from different signal sources. The method also includes digitizing the mixture signal by the ADC and generating a first digitized signal and a second digitized signal. The first digitized signal is the same or identical to the second digitized signal. The method additionally includes delaying the first digitized signal by a predetermined time delay and processing the second digitized signal in a neuromorphic signal processor to extract an extracted signal from the second digitized signal. The predetermined time delay of the first digitized signal corresponds to a delay embedding in the neuromorphic signal processor. The method also includes adjusting a phase delay and amplitude of the extracted signal based on a phase delay and amplitude of the first digitized signal. The method further includes cancelling an adjusted extracted signal from the first digitized signal to provide an input examination signal.

In accordance with a another embodiment, a system for removing an extracted radio frequency (RF) signal to examine a spectrum of at least one other RF signal includes an analog-to-digital converter (ADC) for receiving a mixture signal. The mixture signal includes a plurality of separate source signals from different signal sources. The ADC digitizes the mixture signal and generates a first digitized signal and a second digitized signal. The first digitized signal is the same or identical to the second digitized signal. The system also includes a delay circuit for delaying the first digitized signal by a predetermined time delay. The system also includes a neuromorphic signal processor for processing the second digitized signal to extract an extracted signal from the second digitized signal. The predetermined time delay of the first digitized signal corresponds to a delay embedding in the neuromorphic signal processor. The system additionally includes a signal phase and amplitude adjustment module that adjusts the extracted signal based on a phase delay and amplitude of the first digitized signal. A summing junction is provided for cancelling an adjusted extracted signal from the first digitized signal to provide an input examination signal.

In accordance with a further embodiment, a computer program product for removing an extracted radio frequency (RF) signal to examine a spectrum of at least one other RF signal includes a computer readable storage medium having program instructions embodied therewith. The computer readable storage medium is not a transitory medium per se. The program instructions are executable by a device to cause the device to perform a method including receiving a mixture signal by an analog-to-digital converter (ADC), the mixture signal comprising a plurality of separate source signals from different signal sources. The method also includes digitizing the mixture signal by the ADC and generating a first digitized signal and a second digitized signal. The first digitized signal is the same or identical to the second digitized signal. The method also includes delaying the first digitized signal by a predetermined time delay and processing the second digitized signal in a neuromorphic signal processor to extract an extracted signal from the second digitized signal. The predetermined time delay of the first digitized signal corresponds to a delay embedding in the neuromorphic signal processor. The method additionally includes adjusting a phase delay and amplitude of the extracted signal based on a phase delay and amplitude of the first digitized signal. The method further includes cancelling an adjusted extracted signal from the first digitized signal to provide an input examination signal.

In accordance with another embodiment or any of the previous embodiments, the method further includes amplifying the mixture signal before the mixture signal is received by the ADC. The mixture signal is amplified to a predetermined amplitude for sampling by the ADC.

In accordance with another embodiment or any of the previous embodiments, the method further includes determining a phase delay and amplitude of the extracted signal and the first digitized signal and generating an adjustment to the extracted signal based on the phase delay and amplitude of the first digitized signal.

In accordance with another embodiment or any of the previous embodiments, adjusting the phase delay and amplitude of the extracted signal includes generating an adjusted extracted signal that is 180 degrees out of phase with the first digitized signal.

In accordance with another embodiment or any of the previous embodiments, processing the second digitized signal in the neuromorphic signal processor includes receiving the second digitized signal by the neuromorphic signal processor; generating a delay embedded mixture signal based on the second digitized signal; linearly mapping the delay embedded mixture signal into a reservoir; creating a multi-dimensional state-space representation of the mixture signal by combining the delay embedded mixture signal with a plurality of reservoir states; and identifying at least one of the separate source signals that collectively form the mixture signal based on the multi-dimensional state-space representation of the mixture signal. At least one identified separate source signal is the extracted signal.

In accordance with another embodiment or any of the previous embodiments, the method further includes linearly mapping the multi-dimensional state-space representation to one or more output nodes in an output layer to generate a set of pre-filtered signals.

In accordance with another embodiment or any of the previous embodiments, the method further includes identifying at least one of the separate source signals by adaptively filtering the pre-filtered signals.

In accordance with another embodiment or any of the previous embodiments, adaptively filtering the pre-filtered signals includes passing the pre-filtered signals through a bank of adaptable filters, wherein each pre-filtered signal is fed into a unique filter in the bank of adaptable filters, each unique filter having an adaptable center frequency.

In accordance with another embodiment or any of the previous embodiments, the output layer includes a set of output nodes. Each output node receives a weighted output from each reservoir processing node as an input, and each output node sums a value of each input to produce an output of the output node.

In accordance with another embodiment or any of the previous embodiments, each output node in the output layer includes a unique and adaptable set of output weights on its input connections, such that one or more mixture signals or second digitized signals are passed into the neuromorphic signal processor. The adaptable output weights are configured so that output from a given output node amplifies a subset of source signals while suppressing other source signals.

In accordance with another embodiment or any of the previous embodiments, the method further includes deriving an error signal based on an output from each adaptable filter. The error signal is used to update the adaptable center frequency of the adaptable filter and update the adaptable output weights in the output layer.

In accordance with another embodiment or any of the previous embodiments, the system further includes an amplifier that amplifies the mixture signal before the mixture signal is received by the ADC. The amplifier amplifies the mixture signal to a predetermined amplitude for sampling by the ADC.

In accordance with another embodiment or any of the previous embodiments, the system further includes a phase delay and amplitude computation module for determining a phase delay and amplitude of the extracted signal and the first digitized signal and generating an adjustment to the extracted signal based on the phase delay and amplitude of the first digitized signal.

In accordance with another embodiment or any of the previous embodiments, the system further includes a signal phase and amplitude adjustment module for adjusting a phase delay and amplitude of the extracted signal based on the first digitized signal.

In accordance with another embodiment or any of the previous embodiments, the signal phase and amplitude adjustment module adjusts the phase delay of the extracted signal to generate the adjusted extracted signal that is 180 degrees out of phase with the first digitized signal.

In accordance with another embodiment or any of the previous embodiments, the neuromorphic signal processor includes a delay embedding module, a reservoir, an output layer, and a bank of adaptable filters. The delay embedding module is configured to receive the second digitized signal and generate a delay embedded mixture signal. The reservoir is configured to linearly map the delay embedded mixture signal into the reservoir to create a multi-dimensional state-space representation of the mixture signal by combining the delay embedded mixture signal with a plurality of reservoir states. The output layer is configured to generate a set of pre-filtered signals by linearly mapping the state-space representation to one or more output nodes in the output layer. The bank of filters is configured to generate the separate source signals that collectively formed the mixture signal by processing the pre-filtered signals through the bank of adaptable filters, at least one of the separate source signals being identified as the extracted signal.

In accordance with another embodiment or any of the previous embodiments, the reservoir includes a plurality of processing nodes and the output layer includes a set of output nodes. Each output node receives a weighted output from each reservoir processing node as an input. Each output node sums these values together to produce its output weight. The output weight of each output node amplifies a subset of the source signals while suppressing others. The extracted signal being identified from the separate source signals.

The features, functions, and advantages that have been discussed can be achieved independently in various embodiments or may be combined in yet other embodiments further details of which can be seen with reference to the following description and drawings.

DETAILED DESCRIPTION

Figure 1:
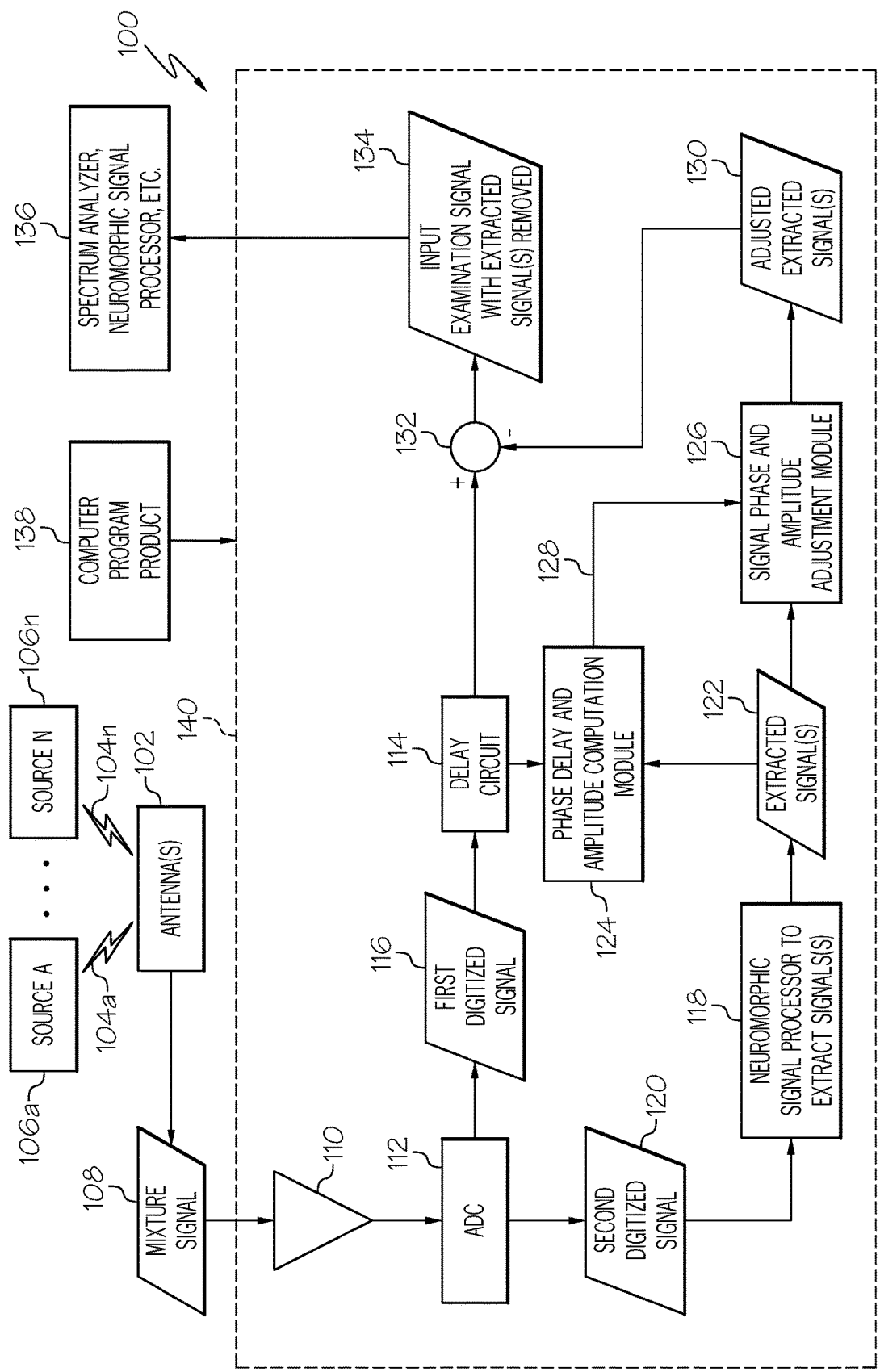
FIG. 1 is a block schematic diagram of an example of a system for removing an extracted signal from a mixture signal to analyze at least one other signal in the mixture signal in accordance with an embodiment of the present disclosure.

The following detailed description of embodiments refers to the accompanying drawings, which illustrate specific embodiments of the disclosure. Other embodiments having different structures and operations do not depart from the scope of the present disclosure. Like reference numerals may refer to the same element or component in the different drawings.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

FIG. 1 is a block schematic diagram of an example of a system 100 for removing an extracted signal from a mixture signal to analyze at least one other signal in the mixture signal in accordance with an embodiment of the present disclosure. The at least one other signal may be a lower level signal or signal with a lower amplitude than the removed signal. Therefore, the system 100 is usable for removing a signal to examine a spectrum of a lower level signal than the removed signal.

The system 100 includes one or more antennas 102 that receive radio frequency (RF) source signals 104a-104n from a plurality of different RF signal sources 106a-106n. The RF source signals 104a-104n or portions of the RF source signals 104a-104n may be received by the antenna 102 simultaneously and form a mixture signal 108 or mixture signals over time. Portions of the RF source signals 104a-104n received by the antenna 102 may partially overlap in time. The system 100 also includes an amplifier 110 for receiving the mixture signal 108 from the antenna 102. The amplifier 110 amplifies the mixture signal 108 to a level that the amplitude of the mixture signal is sufficient for sampling the mixture signal 108 by an analog-to-digital converter (ADC) 112. Accordingly, the amplifier 110 amplifies the mixture signal 108 to a predetermined level or amplitude that permits the ADC to effectively sample or digitize the mixture signal 108. In accordance with an example, the mixture signal 108 needs to be amplified because some of the source signals 104a-104n or a source signal of interest for analysis may have a significantly smaller amplitude than other source signals 104a-104n that form the mixture signal 108 and amplification of the mixture signal 108 also amplifies the source signal of interest within the mixture signal 108 so that another higher amplitude source signal or signals can be extracted and removed from the mixture signal 108 or from a digital representation of the mixture signal 108 as described herein for analysis of the source signal of interest.

The ADC 112 samples or digitizes the mixture signal 108 and generates a first digitized signal 116 and a second digitized signal 120. The first digitized signal 116 and the second digitized signal 120 are similar signals or identical and are each a digital representation of the mixture signal 108. Accordingly, the first digitized signal 116 may also be referred to as the first digitized mixture signal and the second digitized signal 120 may also be referred to as the second digitized mixture signal.

A delay circuit 114 receives the first digitized signal 116 from the ADC 112. The delay circuit 114 delays the first digitized signal 116 a predetermined time delay.

The system 100 additionally includes a neuromorphic signal processor 118 that receives the second digitized signal 120 from the ADC 112. The neuromorphic signal processor 118 processes the second digitized signal 120 to extract an extracted signal 122 or signals from the second digitized signal 120. The predetermined time delay of the delay circuit 114 corresponds to a delay embedding in the neuromorphic signal processor 118. An example of a device that may be configured for use as neuromorphic signal processor 118 is a cognitive blind source separator such the cognitive blind source separator described in U.S. patent application Ser. No. 15/073,626, filed Mar. 17, 2016, which is incorporated herein by reference. The exemplary cognitive blind source separator configured for use as neuromorphic signal processor 118 will be described with reference to FIGS. 2-5 herein.

A phase delay and amplitude computation module 124 receives the extracted signal 122 from the neuromorphic signal processor 118 and the delayed first digitized signal 116 from the delay circuit 114. The phase delay and amplitude computation module 124 determines a phase delay and amplitude of the extracted signal 122 and the delayed first digitized signal 116. The phase delay and amplitude computation module 124 determines any adjustments that need to be made to the extracted signal 122 relative to the delayed first digitized signal 116 so that the signals will be exactly 180 degrees out of phase with one another to cause cancellation (nulling) of the extracted signal 122 from the delayed first digitized signal 116.

A signal phase and amplitude adjustment module 126 receives the extracted signal 122 from the neuromorphic signal processor 118 and an output 128 from the phase delay and amplitude computation module 124. The output 128 corresponds to an adjustment to the extracted signal 122 based on a phase of the delayed first digitized signal 116. The signal phase and amplitude adjustment module 126 adjusts a phase delay and amplitude of the extracted signal 122 using the output 128 from the phase delay and amplitude computation module 124 so that an adjusted extracted signal 130 output from the signal phase and amplitude adjustment module 126 will be 180 degrees out phase with respect to the delayed first digitized signal 116.

The system 100 further includes a summing junction 132 or other mechanism for cancelling or removing the adjusted extracted signal 130 from the delayed first digitized signal 116 to provide an input examination signal 134 with the extracted signal 122 or adjusted extracted signal 130 removed. Because the adjusted extracted signal 130 is 180 degrees out of phase with the first digitized signal 116, the adjusted extracted signal 130 is cancelled when the adjusted extracted signal 130 and the first digitized signal 116 are combined in the summing junction 132. The input examination signal 134 is essentially the digitized mixture signal 108 or input signal to the system 100 with a particular signal in the mixture signal 108 extracted and cancelled from the digitized mixture signal 108. The input examination signal 134 is analyzed. In accordance with an embodiment, a spectrum of the input examination signal 134 is examined by a device 136. In accordance with an embodiment the device 136 is a spectrum analyzer or, in another example, the device is a neuromorphic signal processor or other device. In other embodiments, other parameters associated with the input examination signal 134 are analyzed by a particular device.

In accordance with an embodiment, at least some components of the system 100 may be provided on a single chip 140 as illustrated by the broken line in FIG. 1.

Figure 2:
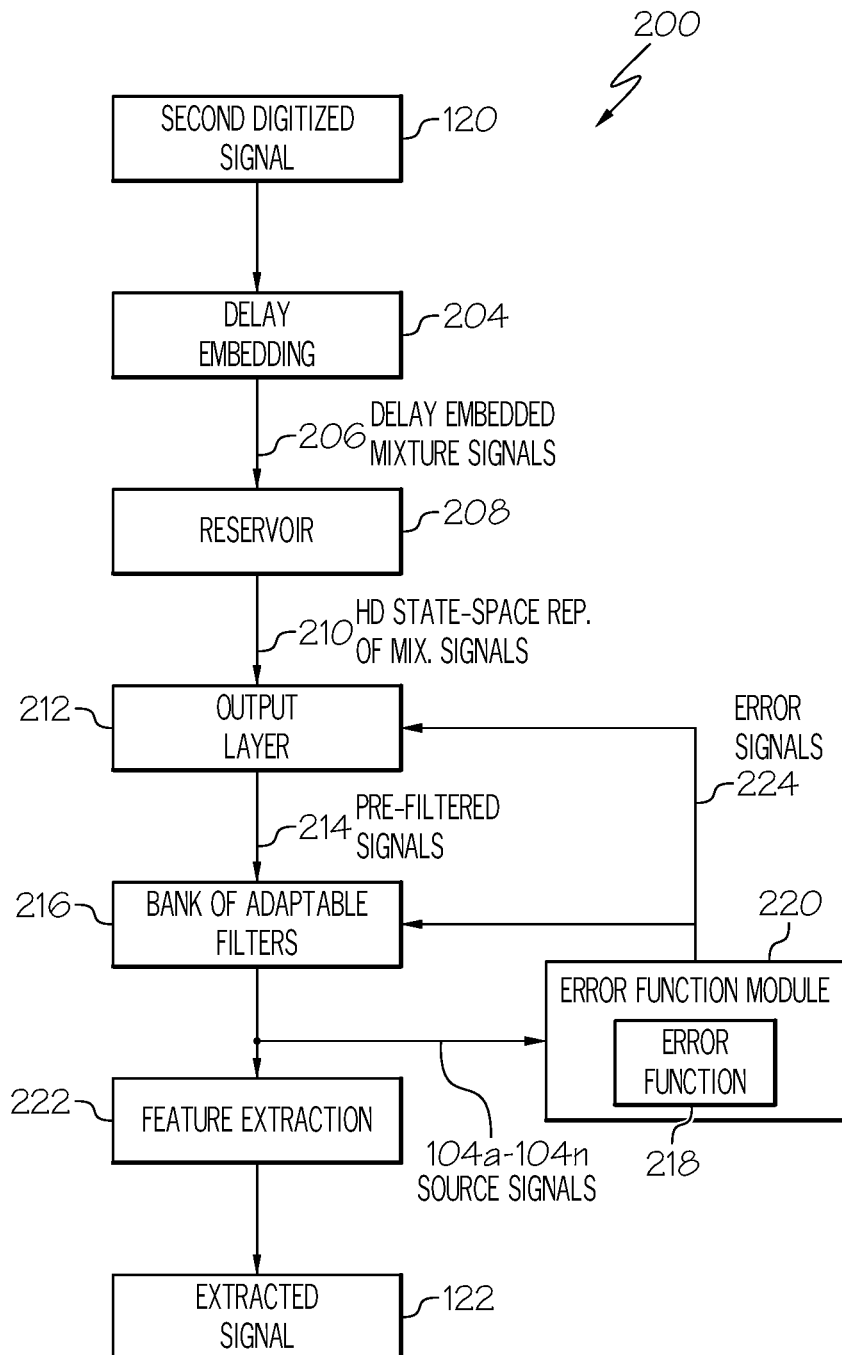
FIG. 2 is a block schematic diagram of an example of a neuromorphic signal processor to extract a signal or signals in accordance with another embodiment of the present disclosure.

FIG. 2 is a block schematic diagram of an example of a neuromorphic signal processor 200 to extract a signal or signals in accordance with another embodiment of the present disclosure. The exemplary neuromorphic signal processor 200 may be used for the neuromorphic signal processor 118 in FIG. 1. The exemplary neuromorphic signal processor 200 receives the second digitized signal 120. In accordance with an example, the second digitized signal 120 is characterized as an input mixture signal containing a noisy mixture of multiple pulses that each have a narrow instantaneous bandwidth. The neuromorphic signal processor 200 provides as an output the separated and denoised pulses from the input mixture signal or second digitized signal 120. The exemplary neuromorphic signal processor 200 may also be referred to as a cognitive blind source separator (CBSS) that is operable for separating multiple temporally correlated source radio frequency (RF) signals. Embodiments of the neuromorphic signal processor 200 assume that the source signals each occupy a narrow frequency bandwidth, and while the signals can overlap temporally, it is assumed that the signals can overlap simultaneously in time and frequency only very rarely. Non-limiting examples of such source signals include the radio frequency (RF) signals used for radar and ultrasonic acoustic pulses used for sonar, or audio signals as used in separating multiple speech signals.

The second digitized signal 120 or digitized mixture signal or signals may also be characterized as a time-series of data points that are samples from one or more mixtures of source signals 104a-104n to be extracted. The time-series of data points of the second digitized signal 120 are fed through a delay embedding module 204 that creates a time-lag version of the input signal, i.e., a delay embedded mixture signal 206. The delay embedding module 204 receives the second digitized signal 120 and generates the delay embedded mixture signal 206 or signals. The delay embedding module 204 stores a finite number of past signal values, thus turning the scalar-valued mixture signals 108 into multi-dimensional signals. The delay embedding module 204 constructs a multi-dimensional vector for current and past signal values. The delay embedded mixture signal 206 or signals are mapped into a reservoir 208 via linear functions. The reservoir 208 is adapted to linearly map the delay embedded mixture signals 206 into the reservoir 208 to create a high-dimensional (HD) or multi-dimensional state-space representation 210 of the delay embedded mixture signals 206. Thus, the delay embedded mixture signals 206 are linearly mapped into the reservoir 208 as describe in more detail below. The reservoir 208 is a dynamical system and the combination of the reservoir states and delay embedded mixture signals 206 create the multi-dimensional state-space representation 210 of the original mixture signals 108 or second digitized signal 120. For example, particular neurons or processing nodes (404 in FIG. 4) in the reservoir 208 may represent specific source signals, such as RF source signals 104a-104n in FIG. 1. The linear mapping of the input in the multi-dimensional state-space representation can also be explained mathematically. Let $\underline{u}[n] = [u_0(t), u_0(t-\tau), u_0(t-2\tau), \ldots, u_0(t-(k-1)\tau)]^T$ be the k-dimensional delay-embedded input and $\underline{x}[n]$ be a vector representing the m-dimensional reservoir state, where $u_0(t)$ is the value of the input signal at continuous time t, and $\tau$ is the time delay between samples in the embedding. The reservoir state is computed as a linear function of the current delay-embedded input vector u[n] and the previous state vector:

$$\underline{x}[n] = \underline{A}\underline{x}[n-1] + \underline{B}\underline{u}[n].$$

Here, $\underline{A}$ is an m×m matrix that specified the reservoir connectivity and $\underline{B}$ is an m×k matrix that specifies the linear mapping of the input into the reservoir 208. A non-limiting example of choices for $\underline{A}$ and $\underline{B}$ is to generate them randomly (e.g, each entry is drawn from an independent Gaussian distribution with zero mean and unit variance), and then the matrices are normalized by being divided by scalars that ensure that each matrix has a spectral norm strictly less than one.

The state-space representation 210 is mapped to a fixed number of output nodes 502a-502n (FIG. 5) in an output layer 212 by different linear combinations of the states of the reservoir 208 in order to generate the pre-filtered signals 214. There is a unique linear function for each output node 502a-502n in the output layer 212. Thus, the reservoir state-space representation 210 of the delay embedded mixture signals 206 is linearly mapped into the output layer 212. The output layer 212 is adapted to generate a set of pre-filtered signals 214 by linearly mapping the state-space representation 210 to one or more output nodes 502a-502n (FIG. 5) in the output layer 212. Note that the terms "linear combinations" and "linear function" are used synonymously herein. The different linear functions are learned, for example, the same way that the filter center frequencies are learned in order to minimize the error function. For example, the neuromorphic signal processor 200 obtains a derivative of an error function 218 in an error function module 220 with respect to the weights of the different linear functions and adapts the weights along with the filter center frequencies.

Each output node 502a-502n of the output layer 212 is associated with a unique finite filter in a bank of adaptable filters 216. In accordance with an embodiment, the bank of adaptable filters 216 includes finite impulse response (FIR) filters and infinite impulse response (IIR) filters. The bank of adaptable filters 216 are adapted to generate separate source signals 104a-104n that collectively form the mixture signal 108 (FIG. 1) by processing the pre-filtered signals 214 through the bank of adaptable filters 216. The pre-filtered signals 214 are passed through their respective adaptable filters 216 in the bank to identify and extract the source signals 104a-104n that were originally mixed together to form the mixture signal 108. Thus the outputs from the adaptable filters 216 are the original source signals 104a-104n and represent the final output of the neuromorphic signal processor 200, 118 (FIG. 1). Features, such as pulse descriptor words (PDW's), may be extracted from the separated source signals 104a-104n using an applicable feature extracting module 222. In various other embodiments, the system or neuromorphic signal processor 200 generates the source signals 104a-104n or sorts signal data (as opposed to identifying/extracting the source signals) and/or stores the separated source signals 104a-104n or data signals.

The output of the bank of adaptable filters 216 is also passed into the error function module 220 from which an error signal 224 or signals are derived. The error signal 224 or signals are used to update the center frequencies of the adaptable filters 216 and the weights in the linear combinations associated with the output nodes 502a-502n (FIG. 5) of the output layer 212 to achieve extraction of the extracted signal 122. This adaptation leads to the adaptable filters 216 and separating the source signals 120a-120n. These aspects are described in further detail below.

Figure 3:
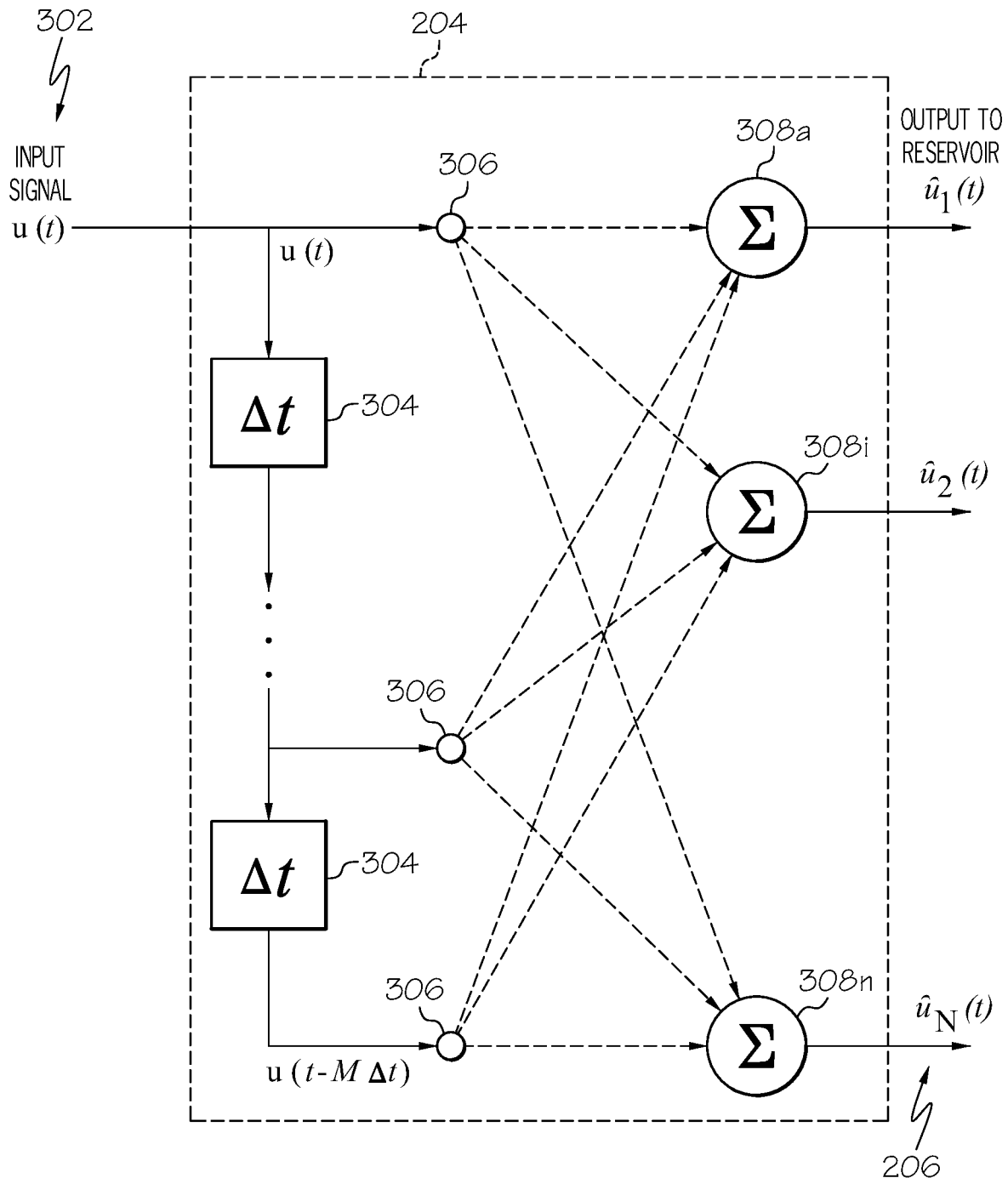
FIG. 3 is a block schematic diagram of an example of a delay embedding module of the neuromorphic signal processor of FIG. 2.

Referring also to FIG. 3, FIG. 3 is a block schematic diagram of an example of the delay embedding module 204 of the neuromorphic signal processor 200 of FIG. 2. As previously described, the second digitized signal 120 or second digitized mixture signal that forms the input signal 302 (u(t)) to the neuromorphic signal processor 200 is continuously passed through the delay embedding module 204, which creates delay embedding mixture signals 206. The delay embedding is a first step in capturing the dynamics of the different source signals 104a-104n (FIG. 1) that reside within the mixture signal 108. The input signal 302 is made up of the mixtures of source signals 102a-102n. The input signal 302 is passed through a finite series of delays 304 to create the delay embedding. A time-gap ($\Delta t$) between delayed values is constant. A tap 306 is associated with each delay 304 and distributes delayed signal values from each delay 304 to a plurality of summing nodes 308a-308n. The summing nodes 308a-308n are responsible for generating the delayed embedded mixture signals 206 which is the input to the reservoir 208. There is one summing node 308a-308n per processing node 404 (FIG. 4) in the reservoir 208. Each summing node 308a performs a unique linear combination of each delayed signal value from each second digitized mixture signal 120. These different linear combinations assist in amplifying source signal 104a-104n dynamics that lie within different frequency bands, and are thus a first step in the source signal separation process.

The input signal 302, u(t), which may be a vector, is made of the second digitized signals 120. The finite series of delays 304 is applied to each of the second digitized mixture signals 120, thus generating a plurality of delay embedding signals, u(t), u(t−$\Delta t$), . . . u(t−M$\Delta t$). Here, $\Delta t$ is the time-gap between consecutive values in the delay embedded representation of the input signal 302 (i.e., the time-gap between taps 306), and M is the total number of delays 304. Conceptually, one can think of each second digitized mixture signal 120 as passing through its own series of delays 304 with the same values for $\Delta t$ and M. There are N summing nodes 308a-308n, which is equal to the number of processing nodes in the reservoir 208. For a given summing node 308i, each delayed value of each second digitized mixture signal 120 is weighted and passed to the given summing node 308i, which then sums its inputs and produces one of N one-dimensional signals (i.e., delayed embedded mixture signals 206) passed as an input to a corresponding processing node in the reservoir 208. The weights on the connections from the taps 306 to a particular summing node 308i are unique from the weights on the connections from the taps 306 to other summing nodes 308a-308n. This flexibility permits different linear combinations that are able to amplify source signal dynamics that occur within different frequency bands, thus providing a first step towards source signal separation.

Figure 4:
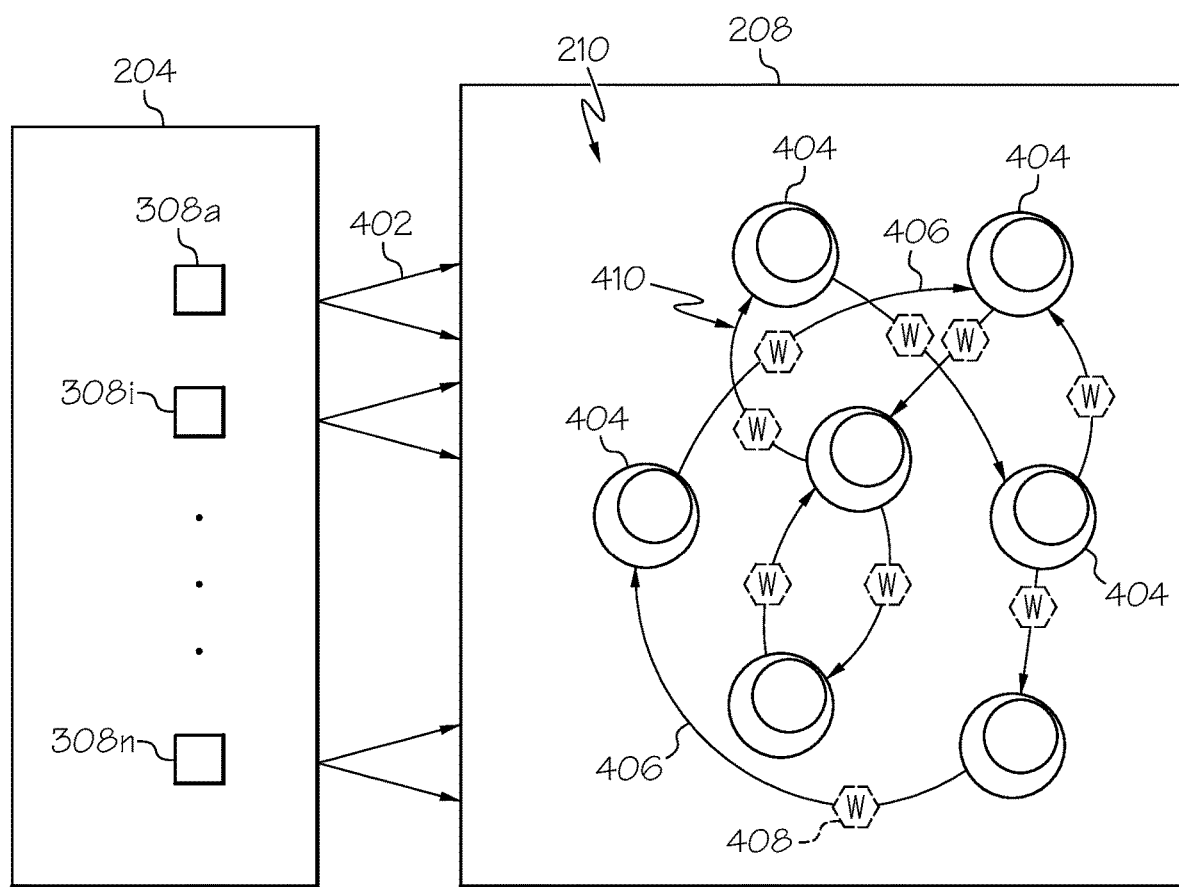
FIG. 4 is a block schematic diagram of an example a reservoir of the neuromorphic signal processor of FIG. 2.

Referring also to FIG. 4, FIG. 4 is a block schematic diagram of an example a reservoir 208 of the neuromorphic signal processor 200 in FIG. 2. The reservoir 208 is a high-dimensional or multi-dimensional dynamical system, which is implemented as a recurrent neural network in accordance with some embodiments. A purpose of the reservoir 208 is to encode time-series data as trajectories in the multi-dimensional state-space of the reservoir 208. In particular, a single point in the state-space of the reservoir 208 encodes information about the history of input data flowing from the delay embedding module 204. Each of the nodes 404 in the reservoir 208 have a set of scalar values that specify the reservoir state. A point in the state-space of the reservoir 208 is a particular choice of scalar values for a particular node 404 in the reservoir 208. In this way the reservoir 208 forms a temporal memory. The delay embedding module 204 and the reservoir 208 work together to create a preliminary separation of the source signals 104a-104n from the mixture signal 108. The reservoir 208 receives inputs 402 from the delay embedding module 204. The inputs 402 from the delay embedding module 204 correspond to the delay embedding mixture signals 206. The reservoir 208 comprises a group of interconnected processing nodes 404 referred to as neurons, which communicate with each other via weighted connections 406. A connection weight 408 is associated with each weighted connection 406. The connection weights 408 are randomly generated (e.g., from a uniform or normal distribution), with only a small percentage of the connection weights 408 (for example about 10%) having non-zero values. In addition, the connection weights 408 are normalized so that when embedded in an adjacent matrix A (i.e., Aij contains the connection weight from processing node i to processing node j), the spectral radius of A is less than 1. Each processing node 404 or neuron computes the weighted sum of its inputs, which includes the input 402 from the delay embedding module 204 as well as the output 410 from other processing nodes 404 in the reservoir 208. The resulting scalar input to each processing node 404 is optionally passed through a nonlinear function (a non-limiting example of one such function is a hyperbolic tangent function) in order to generate the processing node's output 410.

The input-output process of the processing nodes 404 continues over time and the resulting time-series of reservoir neuron states constitutes the points in the multi-dimensional reservoir 208 state-space that encode salient features of the source signals 104a-104n. In this way the reservoir 208 provides a beneficial step in the process of extracting the source signals 104a-104n from the mixture signal or signals 108, 206.

Figure 5:
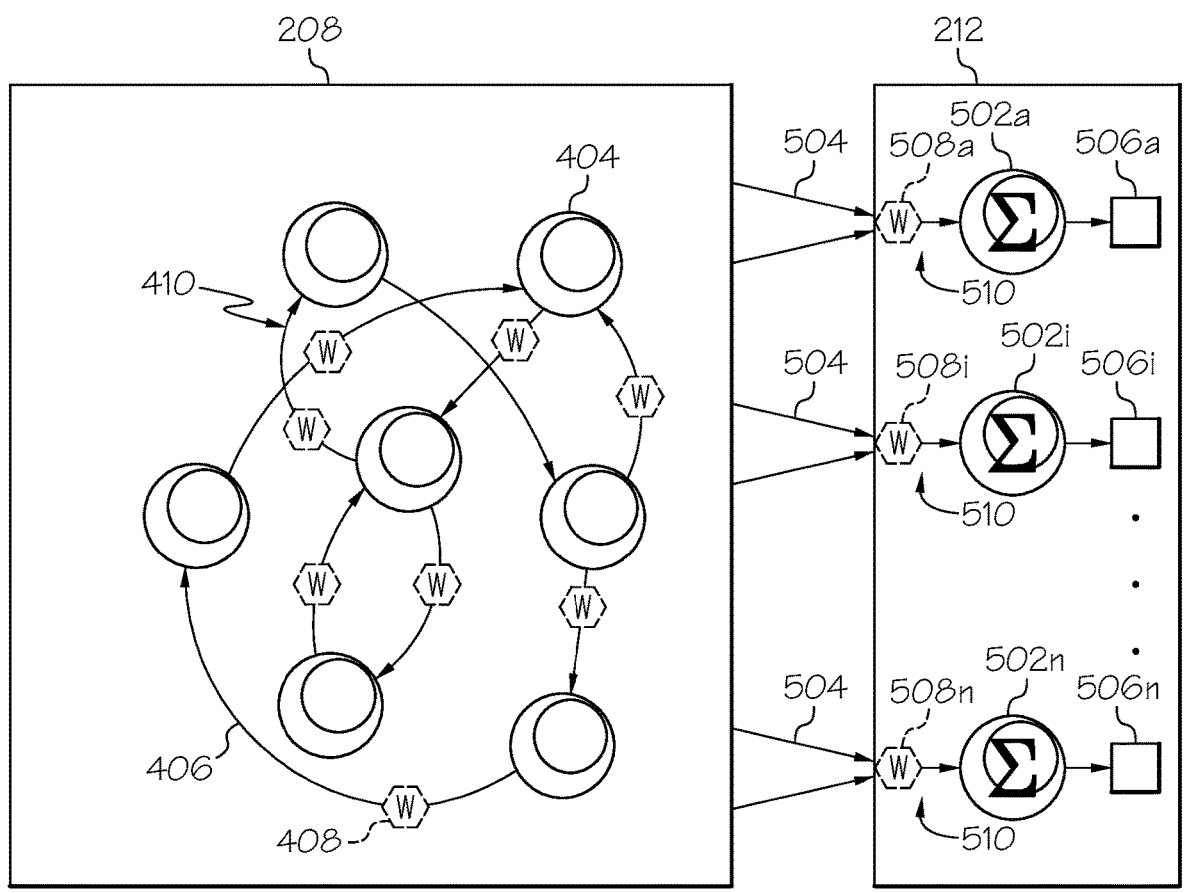
FIG. 5 is a block schematic diagram of an example of the reservoir and an output layer of the neuromorphic signal processor of FIG. 2.

Referring to FIG. 5, FIG. 5 is a block schematic diagram of an example of the reservoir 208 and the output layer 212 of the neuromorphic signal processor 200 of FIG. 2. The output layer 212 includes a set of output nodes 502a-502n in accordance with some embodiments. Each output node 502a-502n receives a weighted output 504 from each processing node 404 or neuron of the reservoir 208 as an input and sums these weighted outputs 504 together to produce an output 506a-506n of the output node 502a-502n. Each output node 502a-502n in the output layer 212 has a unique and adaptable set of weights 508a-508n on its input connections 510 which are referred to as the "output weights"

from the processing nodes 404 of the reservoir 208. As one or more second digitized mixture signals 120 are passed into the neuromorphic signal processor 200, these weights 508a-508n are adapted as described herein so that the output 506a-506n from a given output node 502a-502n amplifies a subset of the source signals 104a-104n while suppressing others. This is the third stage of the process of separating the source signals 104a-104n and from the mixture signal 108, with the first stage being the delay embedding representation of the mixture signal 108 or second digitized mixture signal 120 and the second stage being the reservoir 208 representation.

Referring back to FIG. 2, for some embodiments, the final stage of the neuromorphic signal processor 200 is the bank of adaptable filters 216. The only constraint on the type of filters that may be used for the FIR filters is that the filters have a unimodal gain response in the frequency domain, although ripple is acceptable. A Gaussian type filter is an example of an acceptable FIR filter type. Each filter in the bank of adaptable filters 216 is matched with one of the output nodes 502a-502n in the output layer 212. This produces a set of pairs of adaptable filters 216 and corresponding output nodes 502a-502n. The input to a filter is the output generated by a corresponding output node 502a-502n in the output layer 212.

A center frequency of each filter in the bank of adaptable filters 216 is adaptable or configurable. As a mixture signal 108 or second digitized mixture signals 120 are run through the neuromorphic signal processor 118, 200, the center frequency is configurable in such a way that the center frequency of each adaptable filter 216 converges on a frequency of a unique source signal 104a-104n. In essence, the adaptable filters 216 act as constraints on the outputs 506a-506n of the output nodes 502a-502n in the output layer 212, forcing each output node 502a-502n to extract a single source signal 104a-104n from the mixture signal 108 or signals 202. The frequency of a source signal 104a-104n may be a function of time. The neuromorphic signal processor 118, 200 only requires that a source signal 104a-104n be characterized by a single frequency over any predetermined interval of time. How narrow a frequency band of the source signal 104a-104n and how short the predetermined interval of time are functions of the number of nodes 404 in the reservoir 208 and how many filter coefficients are used.

In some embodiments, such as the example shown in FIG. 2, the error function module 220 is a feedback component of the neuromorphic signal processor 200 and is responsible for guiding the adaptation of the filter center frequencies and adaptable weights 508a-508n on the input connections 510 from the reservoir processing nodes 404 to the output nodes 502a-502n of the output layer 212 (output weights). Conceptually, each adaptable filter 216 and output layer output node 502a-502n pair may be viewed as having their own error function 218, with all individual error functions 218 having the same form. Specifically the error function 218 includes three terms that are summed together. The first term is the negative power of the corresponding filter's output. The negative power is computed:

$$\text{Negative Power} = -\frac{1}{M}\sum_{l=0}^{M-1} y(t-1)^2$$

Where y(t) is the output of the adaptable filter 216 at time t and M is the number of samples used in the average. The first objective is to minimize the negative power (maximize the power), which tends to drive the filter center frequencies towards one of the source signal frequencies. The second term is the sum of squared differences between the filter's output and the output of its corresponding output node 502a-502n in the output layer 212. This leads to the second objective, which is to minimize the discrepancy between the filter's input and its output. This has the effect of limiting the number of source signals 104a-104n in the mixture signal 108 that the adaptable filter 216 is able to "see", and thus helps focus the adaptable filter 216 on a single source signal 104a-104n for extraction. The third term, which is referred to as the "penalty term," prevents the adaptable filters 216 from getting too close to one another in the filter domain and thereby extracting the same source signal. For example, let $dw_{ij}=|w_i-w_j|$, where $w_i$ and $w_j$ are the center frequencies of filter i and filter j, respectively. The penalty term is given by:

Penalty Term=$\Sigma_{j=1}^{N} G(dw_{ij})$, where G is the Gaussian distribution with mean zero end-user-specified variance, and N is the number of adaptable filters 216.

The output of the error function 218 is used to generate the error signal 224. The error signal 224 is used to adapt the filter center frequencies and the weights 508a-508n on the input connections 510 from the reservoir 208 to the output layer 212. The error signal 224 is generated by taking the derivative of the error function 218 with respect to the output weights 508a-508n and filter center frequencies. The system parameters, i.e., filter center frequencies and output weights 508a-508n are adapted by using the derivative to perform gradient descent on the error function 218. As previously described, each adaptable filter 216 and output node 502a-502n pair of the output layer 212 can be thought of as having their own error function 218. For each error function 218, basic gradient descent is used to adapt the output weights 508a-508n, but the neuromorphic signal processor 118, 200 utilizes a unique form of gradient descent that combines local and global search in order to adapt the filter's center frequency. This allows the neuromorphic signal processor 118, 200 to cover an ultra-wide source signal bandwidth of at least 30 GHz, while maintaining the ability to quickly hone in on and track the source signals 104a-104n. For example, in one embodiment, the neuromorphic signal processor 118, 200 fuses Resilient Backpropagation (Rprop) and randomized search. Rprop is described by Igel, C. and Husken, M. in "Improving the Rprop learning algorithm", in Proc. Of the 2nd Int. Symposium on Neural Computation (NC'2000), pp. 115-21, ICSC Academic Press, 2000 which is incorporated herein by reference. The Rprop component uses only the sign information of the gradient rather than its magnitude, making it favorable for limited precision hardware implementation. In addition, the Rprop component uses an adaptive step-size to more precisely track center frequencies. The Rprop update is given by:

$$f_{t+1}=f_t-d_t \cdot \Delta f_t,$$

where $d_t=\text{sgn}(p(x,f_t+\varepsilon)-p(x,f_t))$ is the sign of the derivative of the filter output power, and $\Delta f_t$ is the frequency increment. $\Delta f_t$ is determined by the sequence of sign changes of the output power derivative:

$$\Delta f_t = \begin{cases} \min(\mu_+(f_t - f_{t-1}), \Delta f_{max}) & d_t \cdot d_{t-1} > 0 \\ \max(\mu_-(f_t - f_{t-1}), \Delta f_{min}) & d_t \cdot d_{t-1} = 0 \\ f_t - f_{t-1} & d_t \cdot d_{t-1} = 0 \end{cases}$$

where $\mu_+$, $\mu_-$, $\Delta f_{max}$, and $\Delta f_{min}$ are user-defined parameters that determine the dynamics of the Rprop update. The randomized frequency updates are sampled from a zero-mean Gaussian random variable, where the variance a is a user-specified parameter. The randomized search component operates by generating a small sample of center frequencies from a Gaussian distribution on each step of the adaptation process. This allows a filter center frequency to cover large spans of bandwidth quickly in order to target a specific source signal for tracking. The center frequency proposed by Rprop and those generated by the randomized search component are evaluated under the error function 218 using the current input sequences and current center frequencies in the penalty term. The frequency with the lowest error is chosen as the corresponding filter's next center frequency.

Figure 6:
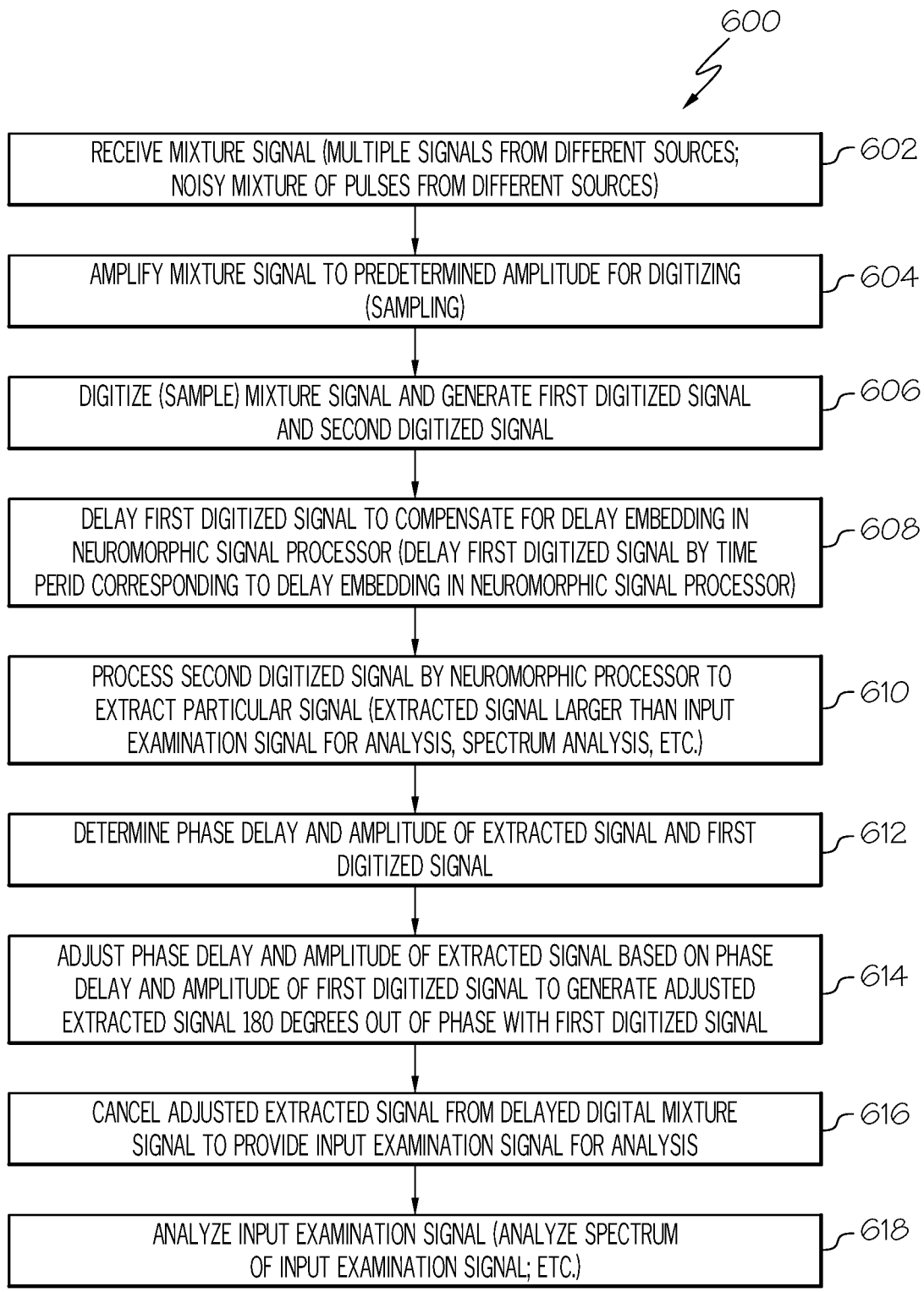
FIG. 6 is a flow chart of an example of a method for removing an extracted signal from a mixture signal to analyze at least one other signal in the mixture signal in accordance with an embodiment of the present disclosure.

FIG. 6 is a flow chart of an example of a method 600 for removing an extracted signal from a mixture signal to analyze at least one other signal in the mixture signal in accordance with an embodiment of the present disclosure. The exemplary method 600 is embodied in and performed by the system 100 in FIG. 1. In another embodiment, the exemplary method 600 is embodied on a computer program product, such as computer program product 138 in FIG. 1 and similar to that described herein. The computer program product 138 is used to load the exemplary method 600 on the system 100. The extracted signal may be a larger or higher amplitude signal than the other signal whose spectrum is being analyzed. In block 602, a mixture signal is received by the system for removing a signal to examine a spectrum of another signal. In some examples, the mixture signal includes a plurality of separate source signals from different signal sources. In other examples, the mixture signal is a noisy mixture of pulses from different sources. In accordance with an embodiment, the mixture signal is received by an ADC. In another embodiment, as illustrated in block 604, the mixture signal is amplified to a predetermined level or amplitude for digitizing or sampling by the ADC. The mixture signal may need to be amplified because some of the source signals or a source signal of interest for analysis may have a significantly smaller amplitude than other source signals that form the mixture signal and amplification of the mixture signal also amplifies the source signal of interest so that another higher amplitude signal or signals can be extracted and cancelled as described herein for analysis of the source signal of interest.

In block 606, the mixture signal or amplified mixture signal is digitized or sampled and a first digitized signal and a second digitized signal are generated. The first digitized signal and the second digitized signal both correspond to the digitized mixture signal and may also be referred to as a first digitized mixture signal and a second digitized mixture signal. The first digitized signal and the second digitized are the same or identical.

In block 608, the first digitized signal or first digitized mixture signal is time delayed a predetermined time delay. The first digitized signal is time delayed to compensate for the delay embedding in a neuromorphic signal processor. Accordingly, the predetermined time delay corresponds to a delay embedding in the neuromorphic signal processor.

In block 610, the second digitized signal or the second digitized mixture signal is processed in a neuromorphic signal processor to extract an extracted signal from the second digitized signal. As previously described, the extracted signal may be larger or have a greater amplitude than another signal received as part of the mixture signal. The other signal is a signal of interest or an input examination signal for analysis, such as spectrum analysis or other analysis. An example of processing the second digitized signal or digitized mixture signal in a neuromorphic signal processor will be described in more detail with reference to FIG. 7.

In block 612, a phase delay and amplitude of the extracted signal and the first digitized signal is determined. Any difference between the phase delay and amplitude of the extracted signal and the first digitized signal is determined or detected so that the extracted signal may be adjusted for cancellation from the first digitized signal. In block 614, a phase delay and amplitude of the extracted signal is adjusted based on the first digitized signal to generate an adjusted extracted signal that is 180 degrees out of phase with the first digitized signal.

In block 616, the adjusted extracted signal is cancelled from the first digitized signal to provide an input examination signal. Because the adjusted extracted signal is 180 out of phase with the first digitized signal, the adjusted extracted signal is cancelled or removed from the first digitized signal when the signals are combined in the summing junction 132 in the example in FIG. 1. In block 618, the input examination signal is analyzed. In accordance with an embodiment a spectrum of the input examination signal is examined or analyzed. In other embodiments, other parameters associated with the input examination signal are analyzed. In accordance with an example, the input examination signal is analyzed by a spectrum analyzer or in another example by a neuromorphic signal processor.

Figure 7:
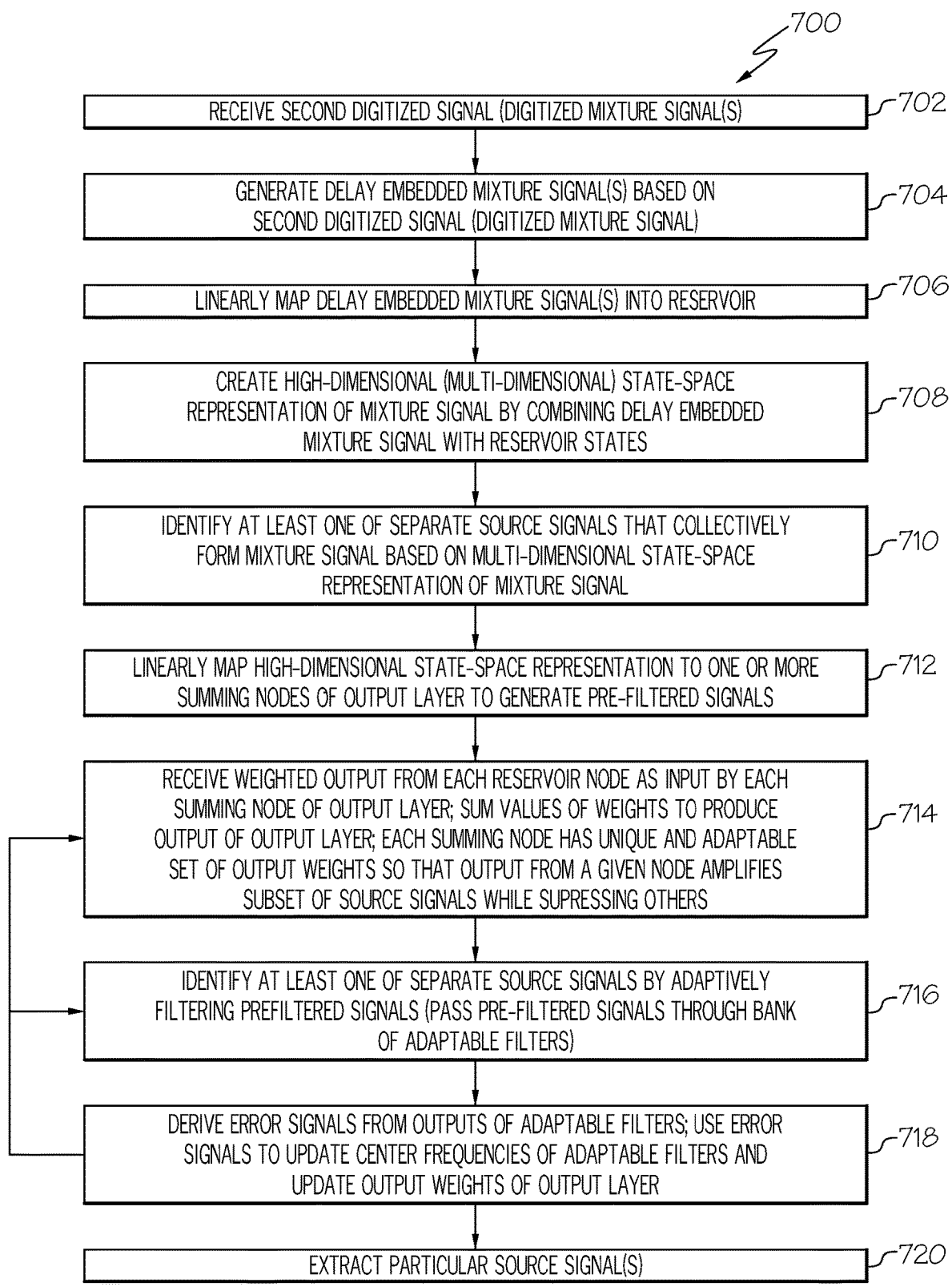
FIG. 7 is a flow chart of an example of a method of extracting a particular signal from a mixture signal in accordance with an embodiment of the present disclosure.

FIG. 7 is a flow chart of an example of a method 700 of extracting a particular signal from a mixture signal in accordance with an embodiment of the present disclosure. The method 700 is an example of extracting a particular signal or signals using a neuromorphic signal processor, such as neuromorphic signal processor 200 described with reference to FIGS. 2-5. The exemplary method 700 is embodied in and performed by the neuromorphic signal processor 200. In another embodiment, the exemplary method 700 is embodied on a computer program product, such as computer program product 138 in FIG. 1. The computer program product is similar to that previously described herein. The computer program product 138 is used to load the exemplary method 700 on the system 100 or neuromorphic signal processor 118.

In block 702, a mixture signal or signals, or second digitized signal is received by the neuromorphic signal processor. In block 704, a delay embedded mixture signal is generated based on the mixture signal or second digitized signal.

In block 706, the delay embedded mixture signal is linearly mapped into a reservoir similar to that previously described with reference to FIGS. 2-4.

In block 708, a multi-dimensional state-space representation is created of the mixture signal by combining the delay embedded mixture signal with a plurality of reservoir states in the reservoir.

In block 710, at least one of the separate source signals that collectively form the mixture signal is identified based on the multi-dimensional state-space representation of the mixture signal. The at least one identified separate source signal is the extracted signal.

In block 712, the multi-dimensional state-space representation is linearly mapped to one or more output nodes of an output layer to generate a set of pre-filtered signals. The output layer includes a set of output nodes and the reservoir comprises a plurality of processing nodes. In block 714, each output node receives a weighted output from each reservoir processing node as an input, and each output node sums a value of each input to produce an output of the output node. Each output node in the output layer includes a unique and adaptable set of output weights on its input connections, such that as one or more mixture signals are passed into the neuromorphic signal processor, the output weights are configured or adapted so that output from a given output node amplifies a subset of source signals while suppressing other source signals.

In block 716, at least one of the separate source signals are identified by adaptively filtering the pre-filtered signals. Adaptively filtering the pre-filtered signals includes passing the pre-filtered signals through a bank of adaptable finite impulse response (FIR) filters. Each pre-filtered signal is fed into a unique filter in the bank of adaptable FIR filters. Each unique filter has an adaptable or configurable center frequency.

In block 718, an error signal is derived based on an output from each adaptable FIR filter. The error signal is fed back to block 716 and is used to update the center frequencies of the adaptable FIR filters similar to that previously described. The error signal is also fed back to block 714 and is used to update the output weights in the output layer similar to that previously described.

In block 720, a particular source signal or signals are extracted from the outputs of the filters. The extracted signal is then cancelled from the mixture signal to provide the input examination signal for spectrum analysis or examination.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of embodiments of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to embodiments in the form disclosed. Many modifications and variations will be apparent to those of ordinary skill in the art without departing from the scope and spirit of embodiments.

Although specific embodiments have been illustrated and described herein, those of ordinary skill in the art appreciate that any arrangement which is calculated to achieve the same purpose may be substituted for the specific embodiments shown and that the embodiments have other applications in other environments. This application is intended to cover any adaptations or variations. The following claims are in no way intended to limit the scope of embodiments of the disclosure to the specific embodiments described herein.

What is claimed is:

1. A method for removing an extracted radio frequency (RF) signal to examine a spectrum of at least one other RF signal, comprising:
    receiving a mixture signal by an analog-to-digital converter (ADC), the mixture signal comprising a plurality of separate source signals from different signal sources;
    digitizing the mixture signal by the ADC and generating a first digitized signal and a second digitized signal, wherein the first digitized signal is the same as the second digitized signal;
    delaying the first digitized signal by a predetermined time delay;
    processing the second digitized signal in a neuromorphic signal processor to extract an extracted signal from the second digitized signal, wherein the predetermined time delay corresponds to a delay embedding in the neuromorphic signal processor;
    adjusting a phase delay and amplitude of the extracted signal based on a phase delay and amplitude of the first digitized signal; and
    cancelling an adjusted extracted signal from the first digitized signal to provide an input examination signal.

2. The method of claim 1, further comprising amplifying the mixture signal before the mixture signal is received by the ADC, wherein the mixture signal is amplified to a predetermined amplitude for sampling by the ADC.

3. The method of claim 1, further comprising determining the phase delay and amplitude of the extracted signal and the first digitized signal and generating an adjustment to the extracted signal based on the phase delay and amplitude of the first digitized signal.

4. The method of claim 3, wherein adjusting the phase delay and amplitude of the extracted signal comprises generating the adjusted extracted signal that is 180 degrees out of phase with the first digitized signal.

5. The method of claim 1, wherein processing the second digitized signal in the neuromorphic signal processor comprises:
    receiving the second digitized signal by the neuromorphic signal processor;
    generating a delay embedded mixture signal based on the second digitized signal;
    linearly mapping the delay embedded mixture signal into a reservoir;
    creating a multi-dimensional state-space representation of the mixture signal by combining the delay embedded mixture signal with a plurality of reservoir states;
    identifying at least one of the separate source signals that collectively form the mixture signal based on the multi-dimensional state-space representation of the mixture signal, the at least one identified separate source signal being the extracted signal.

6. The method of claim 5, further comprising linearly mapping the multi-dimensional state-space representation to one or more nodes in an output layer to generate a set of pre-filtered signals.

7. The method of claim 6, further comprising identifying at least one of the separate source signals by adaptively filtering the pre-filtered signals.

8. The method of claim 7, wherein adaptively filtering the pre-filtered signals comprises passing the pre-filtered signals through a bank of adaptable filters, wherein each pre-filtered signal is fed into a unique filter in the bank of adaptable filters, each unique filter having an adaptable center frequency.

9. The method of claim 8, wherein the bank of adaptable filters comprises a plurality of finite impulse response (FIR) filters and a plurality of infinite impulse response (IIR) filters.

10. The method of claim 8, wherein the output layer comprises a set of output nodes and the reservoir comprises a plurality of processing nodes, each output node receiving a weighted output from each processing node as an input, and each output node summing a value of each input to produce an output of the output node.

11. The method of claim 10, wherein each output node in the output layer comprises a unique and adaptable set of output weights on its input connections, such that as one or more mixture signals are passed into the neuromorphic signal processor, the adaptable output weights are configured so that output from a given output node amplifies a subset of source signals while suppressing other source signals.

12. The method of claim 11, further comprising deriving an error signal based on an output from each adaptable filter, wherein the error signal is used to update the adaptable center frequency of the adaptable filter and update the adaptable output weights in the output layer.

13. A system for removing an extracted radio frequency (RF) signal to examine a spectrum of at least one other RF signal, comprising:
    an analog-to-digital converter (ADC) for receiving a mixture signal, the mixture signal comprising a plurality of separate source signals from different signal sources, the ADC digitizes the mixture signal and generates a first digitized signal and a second digitized signal, wherein the first digitized signal is the same as the second digitized signal;
    a delay circuit for delaying the first digitized signal by a predetermined time delay;
    a neuromorphic signal processor for processing the second digitized signal to extract an extracted signal from the second digitized signal, wherein the predetermined time delay corresponds to a delay embedding in the neuromorphic signal processor;
    a signal phase and amplitude adjustment module that adjusts the extracted signal based on a phase delay and amplitude of the first digitized signal; and
    a summing junction for cancelling an adjusted extracted signal from the first digitized signal to provide an input examination signal.

14. The system of claim 13, further comprising an amplifier that amplifies the mixture signal before the mixture signal is received by the ADC, wherein the amplifier amplifies the mixture signal to a predetermined amplitude for sampling by the ADC.

15. The system of claim 13, further comprising a phase delay and amplitude computation module for determining a phase delay and amplitude of the extracted signal and the phase delay and amplitude of first digitized signal and generating an adjustment to the extracted signal based on the phase delay and amplitude of the first digitized signal.

16. The system of claim 13, wherein the signal phase and amplitude adjustment module adjusts the phase delay of the extracted signal to generate the adjusted extracted signal that is 180 degrees out of phase with the first digitized signal.

17. The system of claim 13, wherein the neuromorphic signal processor comprises:
   a delay embedding module, the delay embedding module receives the second digitized signal and generates a delay embedded mixture signal based on the second digitized signal;
   a reservoir, the reservoir being configured to linearly map the delay embedded mixture signal into the reservoir to create a multi-dimensional state-space representation of the mixture signal by combining the delay embedded mixture signal with a plurality of reservoir states;
   an output layer, the output layer being configured to generate a set of pre-filtered signals by linearly mapping the state-space representation to one or more output nodes in the output layer; and
   a bank of adaptable filters, the bank of filters being configured to generate the separate source signals that collectively formed the mixture signal by processing the pre-filtered signals through the bank of adaptable filters, at least one of the separate source signals being identified as the extracted signal.

18. The system of claim 17, wherein the reservoir comprises a plurality of processing nodes and the output layer comprise a set of output nodes, each output node receives a weighted output from each processing node as an input, each output node sums these values together to produce its output weight, the output weight of each output node amplifies a subset of the source signals while suppressing others, the extracted signal being identified from the separate source signals.

19. The system of claim 13, further comprising a device for examining a spectrum of the input examination signal.

20. A computer program product for removing an extracted radio frequency (RF) signal to examine a spectrum of at least one other RF signal, the computer program product comprising a computer readable storage medium having program instructions embodied therewith, wherein the computer readable storage medium is not a transitory medium per se, the program instructions being executable by a device to cause the device to perform a method comprising:
   receiving a mixture signal by an analog-to-digital converter (ADC), the mixture signal comprising a plurality of separate source signals from different signal sources;
   digitizing the mixture signal by the ADC and generating a first digitized signal and a second digitized signal, wherein the first digitized signal is the same as the second digitized signal;
   delaying the first digitized signal by a predetermined time delay;
   processing the second digitized signal in a neuromorphic signal processor to extract an extracted signal from the second digitized signal, wherein the predetermined time delay corresponds to a delay embedding in the neuromorphic signal processor;
   adjusting a phase delay and amplitude of the extracted signal based on a phase delay and amplitude of the first digitized signal; and
   cancelling an adjusted extracted signal from the first digitized signal to provide an input examination signal.

* * * * *